Sept. 6, 1966 J. D. HUSHER ET AL 3,271,685

MULTIPURPOSE MOLECULAR ELECTRONIC SEMICONDUCTOR DEVICE
FOR PERFORMING AMPLIFIER AND OSCILLATOR-MIXER
FUNCTIONS INCLUDING DEGENERATIVE
FEEDBACK MEANS

Filed June 20, 1963 3 Sheets-Sheet 2

Sept. 6, 1966 J. D. HUSHER ETAL 3,271,685

MULTIPURPOSE MOLECULAR ELECTRONIC SEMICONDUCTOR DEVICE FOR PERFORMING AMPLIFIER AND OSCILLATOR-MIXER FUNCTIONS INCLUDING DEGENERATIVE FEEDBACK MEANS

Filed June 20, 1963 3 Sheets-Sheet 3

United States Patent Office 3,271,685

Patented Sept. 6, 1966

3,271,685

MULTIPURPOSE MOLECULAR ELECTRONIC SEMICONDUCTOR DEVICE FOR PERFORMING AMPLIFIER AND OSCILLATOR-MIXER FUNCTIONS INCLUDING DEGENERATIVE FEEDBACK MEANS

John D. Husher, Greensburg, and James E. McClain, North Belle Vernon, Pa., assignors to Westinghouse Electric Corporation, Pittsburgh, Pa., a corporation of Pennsylvania Filed June 20, 1963, Ser. No. 289,216

9 Claims. (Cl. 325—440)

This invention relates generally to electronic apparatus for the performance of amplifier and oscillator functions, and more particularly, to a molecular electronic semiconductor device which is capable of performing several amplifier functions as well as oscillator-mixer functions.

Molecular electronics is the art in which a single piece of material with predetermined electronic properties is utilized to synthesize circuit functions which usually require many separate active and passive components. A monolithic structure which provides a circuit function is known as a functional electronic block or an integrated circuit.

It is now known in the molecular electronics art that several of the conventional circuit elements such as transistors, diodes, resistors and capacitors may be synthesized within a monocrystalline body of semiconductive material such as silicon. Hence, the fabrication of such devices on a large scale by mass production techniques is becoming more attractive to secure smaller and more lightweight circuit packages which are inherently more reliable than conventionally interconnected circuits because of the avoidance of soldered interconnections between components. However, for integrated circuits to come into widespread use requires not only the technical capability to make their fabrication possible, but also significant cost reduction in design and fabrication so that they are more nearly competitive in price to conventionally fabricated circuits.

Standardization of functional blocks is highly desirable as one means to effect significant cost reductions. For example, there are several amplifier functions which are usually performed by different circuit configurations. Considerable design expense is usually required to develop a block to perform each of the subfunctions of a system under consideration. For example, to perform the system function of a basic radio receiver consisting of a tuned front end, a mixer-oscillator stage, I.F. stages, a detector stage, an AGC stage, and an audio amplifier stage previously required almost a complete design of each stage. Additionally, it is sometimes difficult to modify circuits for different systems, for example, if different gains or frequency responses are required, without necessitating additional block designs.

Any approach to standardization of integrated circuits requires coping with all the problems encountered in the design of a specialized device for a specific function on an increased scale. For example, the device must be adequately temperature stable in all its intended applications. The device should also be of a desired small size to efficiently utilize the semiconductive material. The design of the device should be such that any modifications required to achieve or enhance the performance of different functions may be readily performed.

It is, therefore, an object of the present invention to provide an improved molecular electronic semiconductor device capable of operating as any one of several different types of amplifiers such as video amplifier, an RF amplifier, an IF amplifier, a mixer-oscillator, a low level audio amplifier and a pulse amplifier with no modification of the device being required for the various functions but with slight modifications readily possible to achieve particular characteristics.

Another object of the present invention is to provide a multifunction molecular electronic semiconductor device capable of mass production with economy in the use of materials and without sacrifice in the performance of any of the intended functions.

The present invention, in brief, achieves the foregoing and additional objects by providing a functional electronic block in a unitary body of semiconductive material having a plurality of interacting N and P type semiconductive regions therein which together form a first transistor functional portion, a second transistor functional portion, a plurality of resistance functional portions and a capacitance functional portion; a conductive interconnection pattern is provided on the surface of the unitary body to interconnect selected regions to provide direct coupling between the first and second transistor functional portions, a degenerative feedback network from the second to the first transistor functional portion and a bias resistance network for the first and second transistor functional portions. The capacitance functional portion is provided across the emitter resistance of the second transistor functional portion to obtain a wider frequency response.

One feature of this invention is that the resistance portions in the bias resistance network, as well as in the feedback network, may each be of a magnitude of less than about 3000 ohms so that their fabrication may be achieved within a small voulme of material. Substantial savings are effected through the ability to produce a very large number of individual devices from a single semiconductive wafer. The device requires no modification to provide the various amplifier functions mentioned above. If desired, however, some light modifications may be made to improve the performance of a particular amplifier function. The device used obtains the desired function by the interconnection of appropriate external circuit elements to the proper combination of leads which are provided to the device and extend through the hermetically sealed encapsulation therearound.

In accordance with the present state of the art, some degree of standardization is achieved by providing a standard pattern of active and passive device equivalents (transistors, diodes, capacitors and resistors) within a unitary body of semiconductive material. To obtain a device for a particular circuit function, the active and passive device equivalents are selectively interconnected by a conductive pattern on the device surface. However, devices in accordance with the present invention go beyond this prior art technology by providing a plurality of active and passive device equivalents which with a single, standard, interconnection pattern are capable of multifunction operation. This further reduces fabrication time and cost and, also, more efficiently utilizes the semiconductive material.

Hence, the present invention provides a solution to the problems of functional electronic block design at reduced cost by the selection and integration within a block of a circuit capable of a plurality of functions. The result is a truly standard or "universal" device for amplifier functions.

The present invention together with the above mentioned and additional objects and advantages thereof will become more apparent with reference to the following description, taken in connection with the accompanying drawings, in which.

FIGS. 4 through 10 are cross-sectional views of a semiconductor device at different stages of fabrication to illustrate the structure and techniques for forming devices in accordance with this invention; and FIGS. 11 through 15 are schematic diagrams of circuits providing the functions of, respectively, a video amplifier, an oscillator-mixer, an IF amplifier, a pulse amplifier and an RF amplifier which are achieved by the use of devices in accordance with the present invention.

Figures 1, 2:
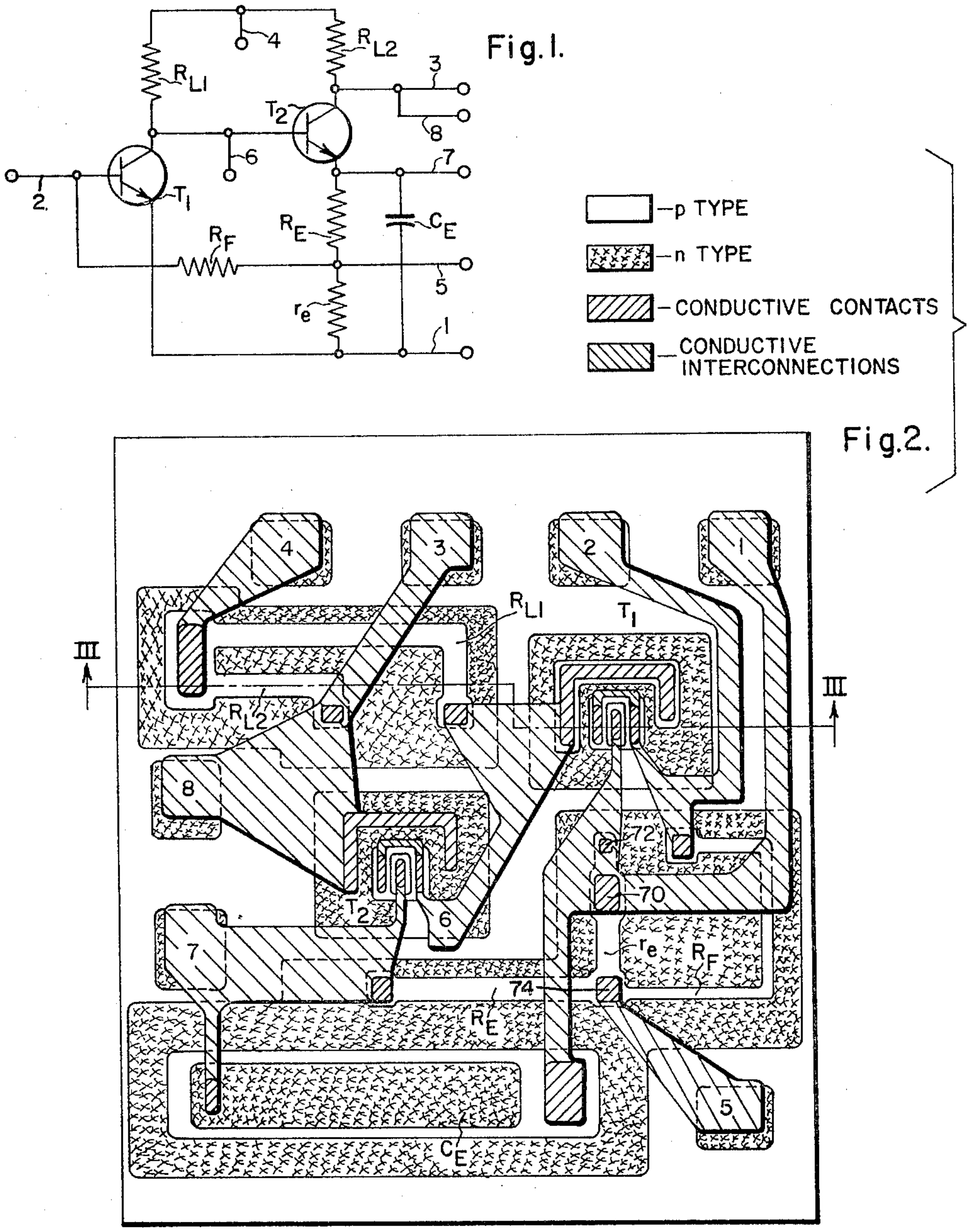
FIG. 1 is a schematic diagram of a multifunctional electronic circuit which is integrated within a monolithic semiconductor device in accordance with this invention.
FIG. 2 is a plan view of a semiconductor device in accordance with the present invention which provides the functions of the circuit of FIG. 1.

Referring to FIG. 1, the circuit comprises first and second transistor amplifier stages, $T_1$ and $T_2$, which are directly coupled from the collector of $T_1$ to the base of $T_2$. Feedback is provided by a degenerative feedback network from the emitter of $T_2$ to the base of $T_1$ through resistances $R_E$ and $R_F$ with resistor $r_e$ connected to their common point. Capacitor $C_E$ is connected across the resistors $R_E$ and $r_e$ for improved frequency response. Resistances $R_{L1}$ and $R_{L2}$ are connected to the collectors of $T_1$ and $T_2$, respectively, to provide load or bias resistances for each amplifier stage.

Eight terminals or external leads, numbered 1 through 8, are provided in the circuit of FIG. 1. Terminal 1 is used as a ground terminal. Terminal 2 is used as a signal input terminal. Terminal 3 is used as a signal output terminal in most applications although, as will be shown, some applications permit deriving the output from one of the other terminals. Terminal 4 is used as a power supply terminal. Terminals 5, 6, 7 and 8 are used, in some applications, for the connection of external components. As is apparent from their common connection, terminals 3 and 8 may be used interchangeably. The significance of the various elements of the circuit of FIG. 1 and the manner in which they cooperate to provide several different circuit functions will be more fully discussed hereinafter.

The degenerative feedback in the circuit of FIG. 1 provides a circuit which is very temperature stable and independent of transistor gain. In a feedback amplifier, gain $$G=\frac{K}{1-BK}$$

where B is the feedback factor and, if the gains of the individual amplifier stages are sufficiently high, the overall gain will be approximately equal to $$-\frac{1}{B}$$

Since B equals $$\frac{r_e}{R_F+r_e}$$

the gain of the circuit depends only upon the ratio of $R_F+r_e$ to $r_e$. This enables flexibility in the fabrication of functional electronic blocks to provide the circuit function of FIG. 1 since only a small number of elements needs to be varied for different gain levels. It is only necessary that the transistor be of substantial gain, above about forty, and that the ratio of $R_F+r_e$ to $r_e$ be controlled. For optimum gain-bandwidth trade, the value of capacitance $C_E$ is equal to $1/15\ r_eF_T$, where $F_T$ is the gain-bandwidth product.

While the circuit of FIG. 1 was originally designed to provide the function of a video amplifier, it was found that semiconductor devices in accordance with this invention wherein the circuit of FIG. 1 is integrated are, by the proper selection of component values, capable of various other amplifier circuit functions.

Figure 3:
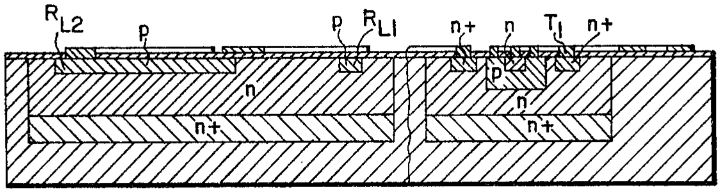
FIG. 3 is a cross-sectional view of the device of FIG. 2 taken along the line III—III.

Referring to FIGS. 2 and 3, a device is shown in accordance with this invention wherein each of the elemental portions which provide the functions of the individual components of FIG. 1 is designated with the same reference letter or numeral as is used in FIG. 1. The device has p and n type semiconductivity regions cooperatively disposed to provide transistor functional portions $T_1$ and $T_2$, resistance functional portions $R_{L1}$, $R_{L2}$, $R_F$, $R_E$ and $r_e$ and a capacitor functional portion $C_E$. The functional portions are selectively interconnected by conductive material disposed on the surface of the device to provide the circuit configuration shown in FIG. 1. In FIG. 2, p-type material has been left unshaded, n-type material has light shading, conductive contacts on the semiconductive material have different sectioning, as is shown by the legend, in order to make the drawing more readily understood. The conductive interconnections are insulated from the semiconductive material by a layer of oxide (such as silicon dioxide where silicon is the semiconductor used). The oxide layer, shown in FIG. 3, covers the entire semiconductor surface except where conductive contacts are made.

The structure and method of fabrication of the device of FIGS. 2 and 3 will be more apparent from consideration of FIGS. 4 through 10 which are a progression of views illustrating the fabrication techniques for a device in accordance with the present invention. The structure of FIGS. 4 to 10 is not intended to illustrate the formation of each individual element of the device of FIGS. 2 and 3 but is rather to show how each type of element is formed so that fabrication of the device of FIGS. 2 and 3 will be apparent.

Figure 4:

In FIG. 4 there is shown in cross section a suitable starting material 10 which, in this example, is a silicon semiconductor wafer of p-type semiconductivity having a resistivity of about 40 ohm-centimeters and a thickness of several mils. The starting wafer may be prepared by any of the known techniques such as by cutting from a grown single crystal silicon rod or it may be prepared from a silicon dendrite in accordance with patent 3,031,-403, issued April 24, 1962. The starting wafer may be of relatively large size, such as about 850 mils in diameter, to permit the simultaneous fabrication of a large number of devices like that of FIG. 2 after which the wafer is divided into individual devices for packaging.

Figure 5:

FIG. 5 shows the starting material 10 after there has been grown upon one major surface thereof an n-type layer 12 by epitaxial growth. This first epitaxial layer is grown to a thickness of about 5 microns with a resistivity of 0.1 ohm centimeter and may be formed by the thermal decomposition of a silicon compound in accordance with known techniques.

Figure 6:
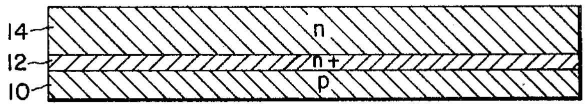

In FIG. 6 the semiconductive body is shown after there has been grown a second n-type epitaxial layer 14 on the upper surface having a thickness of about 10 microns and a resistivity of about 1 ohm centimeter. The first n-type layer 12 is designated "n+" to distinguish it from the more resistive n-type layer 14. It will be appreciated that the thickness dimension in the figures has been grossly exaggerated for clarity.

Figure 7:
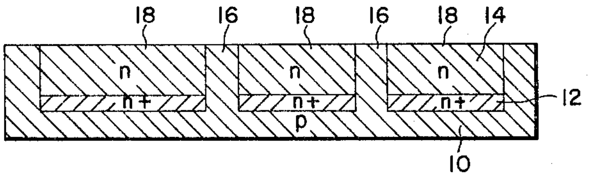

In FIG. 7, the structure is shown after a first selective p-type diffusion has been performed, for example, with boron as the acceptor type impurity to a surface concentration of about $5\times10^{19}$ atoms per cubic centimeter. This first diffusion operation provides walls 16 extending from the starting material 10 to the upper seurface of the device so that a plurality of islands 18 of n-type semiconductivity are provided within the device and are isolated from each other by the p-type material 16. The p-type walls 16 correspond to the unshaded p-type material of FIG. 2. The n-type islands 18 correspond to lightly shaded n-type material of FIG. 2.

Figure 8:
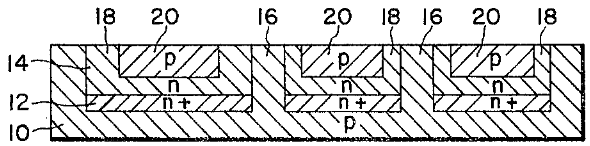

FIG. 8 shows the structure after a second p-type diffusion has been performed within the upper n-type epitaxial layer 14. The regions formed by this diffusion are also shown unshaded in FIG. 2. This diffusion may also be with boron to a surface concentration of about $5\times10^{18}$ atoms per cubic centimeter and is diffused to a thickness of about 4 microns. This diffusion operation provides p-type regions 20 to serve as the base regions of the transistor functional portions and also to serve as resistance functional portions and as one side of the capacitance functional portion.

Figure 9:
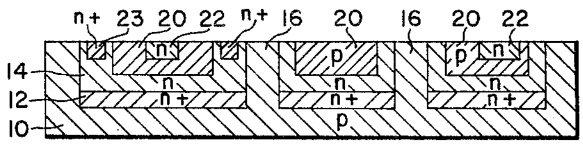

FIG. 9 shows the structure after an n-type diffusion has been performed on the upper surface of some of the p-type regions 20 to provide n-type regions 22 to serve as a transistor emitter in each of the transistor bases and the other side of the capacitance functional portion. Additionally, in this same diffusion operation, a more highly doped n-type region 23 is formed on the upper n-type epitaxial layer 14 for the collector of each transistor functional portion. Regions corresponding to the regions 22 and 23 are also shown lightly shaded in FIG. 2. This diffusion may be performed with prosphorus as the diffused impurity to a surface concentration of about $5\times10^{20}$ atoms per cubic centimeter and a depth of about 3 microns.

Figure 10:
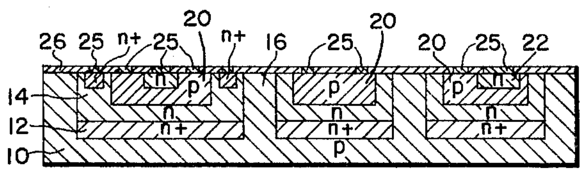

FIG. 10 shows the structure after conductive contacts 25 have been formed on the various regions. The contacts 25 may be of aluminum evaporated onto the material and fused in the selected regions. The aluminum will not form a rectifying junction to the n-type material because of its relatively high doping concentration of about $10^{19}$ atoms per cubic centimeter. To provide the desired functions, the contacts are selectively interconnected by deposited conductive material, which may be deposited at the same time as the materal for contacts 25. An oxide material 26 like that in FIG. 3 covers the semiconductive material except where the contacts 25 are disposed.

In the various fabrication steps requiring diffusion of impurities into selected areas or the formation of contacts on selected areas of the surface of the device, conventional masking techniques employing oxide layers selectively removed using photoresist or other known means may be employed.

It is thus seen that each of the transistor functional portions $T_1$ and $T_2$ are provided within the device by a structure which includes the n-type epitaxial layers 12 and 14 and the diffused n-type region 23 thereon as the collector, the diffused p-type layer 20 as the base and the diffused n-type layer 22 therein as the emitter. Such a structure is shown in the left-hand portion of FIG. 10.

The transistors $T_1$ and $T_2$ preferably have the characteristics which are known to result in a wideband power amplifier. These include a low emitter capacitance which is achieved by having a small emitter junction area and a narrow base width; a low base spreading resistance which is achieved by placing the base contacts close to the respective emitter contacts; and a low collector capacitance which is achieved by having a small collector junction area and a high collector resistance. The double epitaxial structure described herein achieves the desired collector characteristics without increasing series collector resistance since the low resistivity layer 12 is in parallel with the higher resistivity layer 14 relative to the collector contact and it is the latter layer which forms the collector junction.

For good temperature stability the characteristics of the two transistors should be closely matched. This is permitted by the fact that the transistors $T_1$ and $T_2$ are simultaneously fabricated using the same materials and process parameters.

Devices in accordance with this invention typically have the following values of transistor characteristics:

| | | |
|---|---|---|
| Base spreading resistance | ohms | 47–50 |
| Collector capacitance | pfd | 2.0–5.5 |
| Emitter capacitance | pfd | 12–16 |
| $F_T$ (current gain-bandwidth product) | mc | 320–500 |

Each of the functional portions $R_{L1}$, $R_{L2}$, $R_E$, $r_e$ and $R_F$ is provided by one of the p-type regions 20 as shown in the center portion of FIG. 10.

The capacitance $C_E$ is provided by a p-type region 20 and an n-type region 22 thereon as shown in the right-hand portion of FIG. 10. The portion of the device providing capacitance functions is, hence, a diode which when reverse biased acts as a capacitor.

An essential feature of integrated circuit fabrication is that sufficient isolation be provided between elements of the device structure to prevent undesired electrical interaction while maintaining physical unity. The structure of FIGS. 2 to 10 effectively provides the necessary isolation by reason of the diffused p-type material 16 in FIG. 8 extending from the substrate to the top surface. These walls substantially prevent lateral interaction within the device.

The structure preferred utilizes two epitaxial layers 12 and 14 the internal one of which has a lower resistivity than the outer one in order to provide improved characteristics including the reduction of saturation resistance in the transistor regions. This is in accordance with the teaching of copending application Serial No. 193,452, filed May 9, 1962, by H. C. Lin and assigned to the assignee of the present invention, now Patent 3,236,701, Feb. 22, 1966, which should be referred to for further information regarding this type of structure. In the device shown in FIG. 2, an actual structure made by the techniques discussed in connection with FIGS. 4–10 is shown enlarged 120 times.

The resistance functional portions have an area to provide the desired resistance. The diffused regions providing the resistance functional portions have a resistance of 200 ohms per square.

Typical component values provided by the device of FIGS. 2 and 3 are as follows:

| | | |
|---|---|---|
| $R_{L1}$ | ohms | 2.0K |
| $R_{L2}$ | do | 2.5K |
| $R_F$ | do | 5.5K |
| $R_E$ | do | 1.8K |
| $r_e$ | do | 0.5K |
| $C_E$ | pfd | 110 |

Since the gain of devices in accordance with this invention is determined by the ratio of $(R_F+r_e)/r_e$, it is not necessary to exercise as high a degree of control in the diffusion whereby the regions 20 are formed as would otherwise be necessary. The size of the diffused regions can be readily controlled by known masking techniques and, since the resistive regions are diffused simultaneously, the desired gain can be achieved without a precisely controlled surface concentration. It has been found that variation in the size of $R_F$ and $r_e$ permits current gains ranging from about 5 to 50 for the total block.

It will be noted in FIG. 2 that the diffused material providing the resistances $R_F$, $R_E$ and $r_e$ is one continuous diffused region with the distinct resistances being achieved by the appropriate location of contacts on the conductive material. Similarly, $R_{L1}$ and $R_{L2}$ are provided by a single diffused region.

The emitter resistor, $R_E$, provides increased temperature stabilization as does the degenerative feedback from $T_2$ to $T_1$. Also, the resistive areas within the device have a positive temperature coefficient so that as the temperature increases, both $R_F$ and $r_e$ increase and the ratio of $R_F$ and $r_e$ to $r_e$ remains constant. Power gain stability within about 5db or less in video amplifier applications is achieved over a temperature range of from about −50° C. to 125° C.

In FIGS. 11 to 15 typical circuit applications are shown for a device in accordance with this invention wherein the portion of each circuit enclosed by the dashed line is provided by a unitary semiconductive device such as that shown in FIGS. 2 and 3. In each of the circuits the lead 1 is maintained at a reference potential or ground level; lead 2 to the base of $T_1$ is the input signal lead; and lead 4 is for the application of a B+ D.C. supply voltage of 12 volts.

Figure 11:
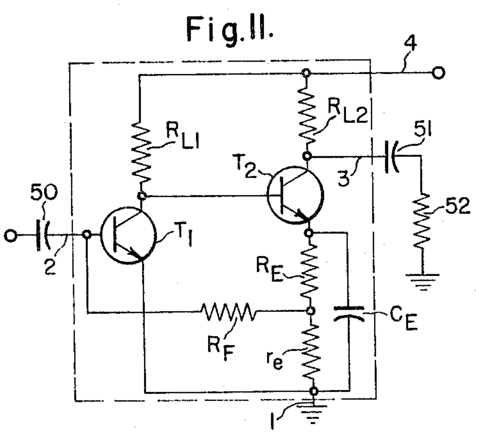

In FIG. 11 a video amplifier is shown with the output taken by lead 3 from the collector of $T_2$ and isolating capacitors 50 and 51 are provided at the input and output, respectively. With a load 52 of 200 ohms, power gains of 25 db were achieved with a cutoff frequency (down 3db) between 6 mc. and 12 mc. In this application the block has an input impedance of about 200 ohms.

Figure 12:
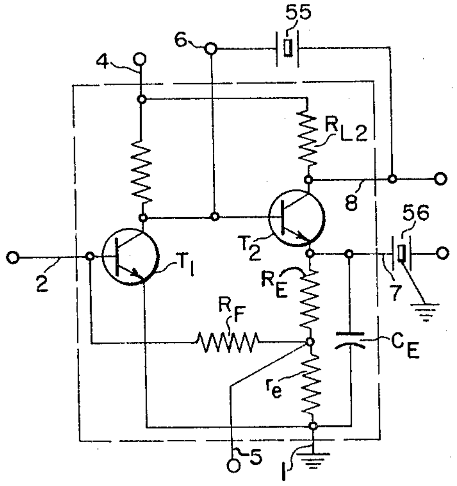
Figure 14:
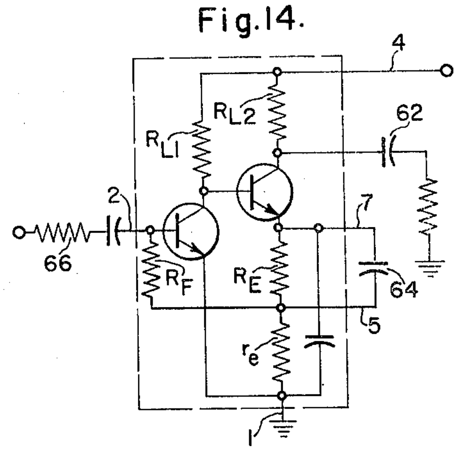

In FIG. 12, to provide an oscillator-mixer function, a quartz crystal 55 is placed between leads 6 and 8 with the output taken from lead 7. The output of the oscillator-mixer may be applied to an IF resonator 56 such as that sold under the trade name Transfilter by Clevite Corporation, which is a lead-zirconium titanate ceramic, and then to an IF amplifier. As an oscillator-mixer the device is capable of conversion gains of 25 db when converting from a 30 mc. modulated carrier to a 455 kc. IF with a 200 ohm load. Other possible locations for the quartz crystal 55 are across leads 6 and 2 when driven by a high impedance source or across leads 5 and 2 when driven by a low impedance source.

Since a degenerative feedback amplifier is intended for stability it may not be immediately apparent that it can be used as an oscillator. The fact that the device shown does oscillate is believed due to the fact that the capacitor $C_E$ shorts out almost all of the negative feedback at frequencies above 20 mc. and therefore reduces the high frequency stability of the system. When the signal is taken off the emitter of $T_2$, as shown, only the beat frequency is present and can be coupled directly to IF stages. This is accomplished because the capacitor $C_E$ does not short out the beat frequency.

Figure 13:
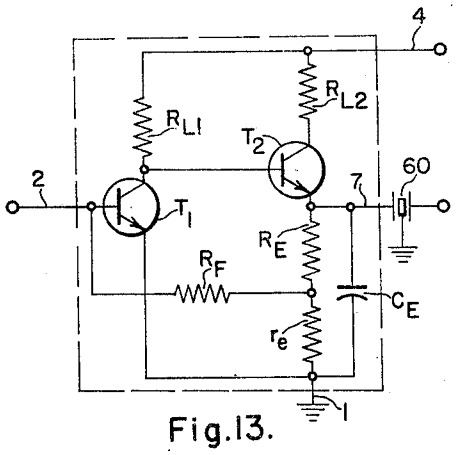

In the IF amplifier of FIG. 13, the output is taken from the lead 7 through a suitable device such as a PZT Transfilter resonator 60 to a 200 ohm load (not shown). In this application the block is capable of power gains of 40 db at 455 kc. The output voltage swing is limited to ½ v. R.M.S. However, if a greater dynamic swing is desired, the output can be taken from either collector area through a PZT Transfilter resonator to the load. A typical three stage IF system would preferably have outputs taken from the emitter of $T_2$ of the first two stages and off the collector of $T_2$ of the third stage.

The use of the device as a low level audio amplifier is not shown but its application for such purpose is apparent. To perform a pulse amplifier function, FIG. 14, the output is taken from the second transistor collector through a microfarad capacitor 62. In this application improved performance is obtained by placing a 1.0 microfarad capacitor 64 from lead 7 to lead 5 to achieve pulse amplitude gains of 15 with rise time of approximately 5 nano-sec. As a pulse amplifier, the current gain is only dependent on the feedback ratio which is approximately 15. The voltage gain is dependent on this current gain multiplied by the ratio $R_{L2}$ to the source impedance. The value $R_{L2}$ is 2.5. With this in mind the circuit can control the voltage gain of the block by the resistor 66 placed in series with the input. The input impedance of this block with a capacitor between leads 7 and 5 is very low (approximately 50 ohms) and the input current is completely dependent on the voltage source and the series resistor.

Figure 15:
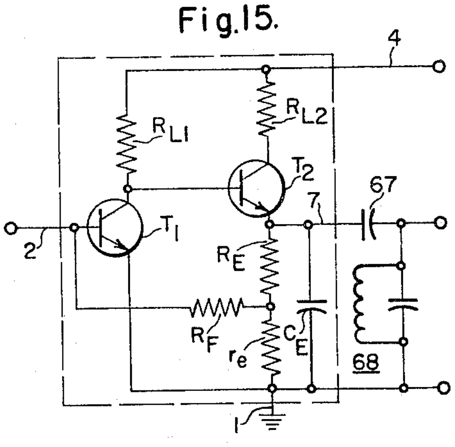

FIG. 15 shows an RF amplifier circuit using a device in accordance with this invention. The output is taken from the emitter of $T_2$ by lead 7 through capacitor 67 to provide an output impedance of from about 100 ohms to 200 ohms with an input impedance of about the same magnitude. The output is derived across an LC resonant circuit 68. As an RF amplifier the device is capable of power gains of 40 db to 4 mc.

All of the devices in accordance with this invention are compatible. A complete radio receiver may comprise a plurality of circuits as in FIGS. 11–15. Devices in accordance with this invention may be interconnected to provide system functions in accordance with known circuit techniques. Certain modifications may be made in the device to enhance its performance in particular applications, some of which will be discussed herein.

It will be noted that the emitter of $T_1$ is grounded in each case. However, if desired to further improve stability a small resistance may be placed in series with the emitter of $T_1$. The device of FIG. 2 may be easily modified for this purpose. It will be noted that the diffused region providing the resistance $r_e$ has a first contact 70 at the extremity thereof. A second contact 72 spaced a short distance from the first contact 70 is shorted to it, in the device as shown, by a conductive interconnection. If this interconnection were not present, the resistance of the material between the two contacts 70 and 72 would be interposed between the emitter and ground. This may be achieved by depositing the interconnecting conductor through a mask which does not permit the formation of a short between the contacts 70 and 72 or by scribing through the conductive material.

Other alternative or additional resistances may be provided within the device. For example, for RF amplifier applications, the value of resistance $R_F$ may be effectively increased to improve the gain by providing additional resistive area between contact 74 of FIG. 2 and the base of $T_1$. This additional resistance could be shorted out when not desired. For pulse amplifier applications, an additional resistive region may be provided between the B+ supply point, terminal 4, and the base of $T_1$ thereby changing the biasing and feedback condition. Also, for pulse amplifier applications a layer of gold evaporated on the lower surface of the device may be alloyed and diffused therein to shorten the carrier lifetime in the substrate and, hence, decrease the storage time.

Devices in accordance with this invention are readily packaged in a double ended, hermetically sealed, gold-coated Kovar alloy package, with the leads 1 to 8 extending through the package. Other known packaging techniques may be employed.

The devices described herein may have regions of opposite semiconductivity type from that shown. For example, the device may be fabricated on an n-type substrate, with p+ and p-type epitaxial layers thereon and n-type diffused regions in the epitaxial layers. However, it has been found to the present to be more convenient to fabricate devices on a p-type substrate, as shown in FIGS. 2 and 3.

Semiconductive materials other than silicon, such as germanium or a III–V compound, may be employed. Silicon, however, is preferred because of greater knowledge of techniques for epitaxial growth and vapor diffusion of impurities with it.

While the present invention has been shown and described in certain forms only, it is apparent that various modifications may be made without departing from the spirit and scope thereof.

What is claimed is:

1. Electronic apparatus for providing any one of a plurality of circuit functions including that of an oscillator-mixer comprising: a unitary body of semiconductive material with a plurality of N and P type semiconductive regions therein providing a first transistor functional portion including emitter, base and collector regions, a second transistor functional portion including emitter, base and collector regions distinct from said emitter, base and collector regions of said first transistor functional portion, a capacitance functional portion, and a plurality of resistance functional portions conductively interconnected to various regions of said first and second transistor functional portions including a first resistance functional portion connected to the collector of said first transistor functional portion and a second resistance portion connected to the collector of said second transistor functional portion for the purpose of biasing said transistor functional portions upon application of a suitable supply potential at the extremity of said resistance portions and a degenerative feedback loop comprising at least one of said resistance functional portions interconnected between the emitter of said second transistor functional portion and the base of said first transistor functional portion; a direct conductive interconnection between the collector of said first transistor functional portion and the base of said second transistor functional portion so that said device is capable of signal amplification with a gain at least comparable to that achieved if only said first transistor functional portion is utilized while using a bias resistance connected to the collector of said first transistor functional portion which is less than about 3000 ohms; said capacitance functional portion being connected across the emitter of said second transistor functional portion and a point of common reference potential; frequency stabilizing means connected to said unitary body between two circuit points each effectively associated with one of said regions of said transistor functional portions to provide an oscillatory signal at a first frequency; means to supply a modulated carrier wave at a second frequency to the base of said first transistor functional portion means to derive an output signal at the beat frequency of said first and second frequencies from the emitter of said second transistor functional portion.

2. A semiconductor device in accordance with claim 1 wherein said plurality of resistance functional portions includes a feedback resistance functional portion ($R_F$) in said degenerative feedback loop and an emitter to ground resistance functional portion ($r_e$) connected from the extremity of said feedback resistance functional portion to said point of common reference potential and the gain of said device is determined by the ratio of the size of $R_F$ and $r_e$ to the size of $r_e$; said capacitance functional portion having a capacitance of a value that shorts out said modulated carrier wave at said second frequency and does not short out said beat frequency.

3. Electronic apparatus for providing oscillator-mixer functions comprising: a multipurpose molecular electronic semiconductor device comprising a unitary body of semiconductive material including a substrate of first type of semiconductivity, a plurality of functional portions integral with said substrate and comprising semiconductive material of second type of semiconductivity, said functional portions being mutually isolated by material of the same semiconductivity type as said substrate extending therebetween, two of said functional portions performing transistor functions with said material of second type semiconductivity serving as a collector region, a region of first type semiconductivity on said collector serving as a base region, and a region of second type semiconductivity on said base serving as an emitter region, a plurality of said functional portions having regions of first type semiconductivity on said material of second type semiconductivity for performing resistance functions and one of said two other functional portions having a first region of first type semiconductivity on said material of second type semiconductivity and second region of second type semiconductivity on said first region for performing capacitance functions; conductive contacts disposed on each of the regions of said transistor functional portions, on each of said regions for performing capacitance functions and on selected points of said regions for performing resistance functions; conductive interconnections for interconnecting said contacts to provide direct coupling between the collector of a first transistor functional portion and the base of a second transistor functional portion, a degenerative feedback network means between the emitter of said second transistor functional portion and the base of said first transistor functional portion, a resistance network comprising one of said resistance functional portions connected to the collectors of each of said transistor functional portions and said capacitance functional portions connected to the emitter of said second transistor functional portion; frequency stabilizing means connected across the base and the collector regions of said second transistor functional portion to provide an oscillatory signal at a first frequency; means to supply a modulated carrier wave at a second frequency to the base region of said first transistor functional portion; means to derive an output signal at the beat frequency of said first and second frequencies from the emitter region of said second transistor functional porton; said capacitance functional portion having a value of capacitance to act as a short across said degenerative feedback loop to said modulated carrier wave at said second frequency and to act as an open circuit to said output signal at said beat frequency.

4. A device in accordance with claim 3 wherein: said unitary body has a planar surface wherein said plurality of functional portions are disposed; said surface is covered with an adherent oxide layer with openings in said layer wherein said contacts are disposed and said conductive interconnections are disposed on the surface of said oxide layer.

5. A device in accordance with claim 3 wherein: said plurality of other functional portions for performing resistance functions include in a first portion with two resistive regions in series between the emitter of said second transistor functional portion and the base of said first transistor functional portion to provide said feedback network, a third resistive region connected to a common contact between said two resistive regions, said regions for performing capacitance functions connected to said emitter of said second transistor functional portion and to the free extremity of said third resistive region; another of said plurality of functional portions including two resistive regions each in series with the collector of one of said transistor functional portions and having a common contact at the other extremity thereof for said resistance network; leads affixed to the connection between said capacitance and said third resistive region, to the base of said first transistor functional portion, to the collector of said second transistor functional portion, to the common contact at the extremity of said two resistive regions in series with the collectors, to the common contact between said two resistive regions providing said feedback network, to the connection between the collector of said first transistor functional portion and the base of said second transistor functional portion and to the emitter of said second transistor functional portion; said output signal at said beat frequency is applied to an IF amplifier substantially like said multipurpose molecular electronic semicoductor device.

6. Electronic apparatus for performing oscillator-mixer functions comprising: first and second transistors each having emitter, base and collector regions with a direct connection between the collector of said first transistoı and the base of said second transistor, a degenerative feedback loop connected between the emitter of said second transistor and the base of said first transistor; a capacitor connected between the emitter of said second transistor and a point of reference potential; first and second resistors connected to the collectors of said first and second transistors, respectively; voltage supply means connected to said resistors remote from said collectors; frequency stabilizing means connected across the base and collector regions of said second transistor to cause oscillation at a first frequency; means to supply a modulated carrier wave at a second frequency to the base of said first transistor; means to derive an output signal at the beat frequency of said first and second frequencies from the emitter of said second transistor; said capacitor having a value of capacitance to act as a short to said modulated carrier wave at said second frequency and to act as an open circuit to said output signal at said beat frequency.

7. Electronic apparatus in accordance with claim 6 wherein: said transistors, said degenerative feedback loop, said resistors and said capacitor are all disposed in a single integrated circuit.

8. Electronic apparatus in accordance with claim 6 wherein: said means to derive an output signal includes an amplifier having a third and a fourth transistor, each having emitter, base and collector regions with a direct connection between the collector of said third transistor and the base of said fourth transistor, a second degenerative feedback loop connected between the emitter of said fourth transistor and the base of said third transistor, a second capacitor connected between the emitter of said fourth transistor and a point of reference potential, and third and fourth resistors connected to the collectors of said third and fourth transistors, respectively.

9. Electronic apparatus in accordance with claim 8 wherein: said first and second transistors, said degenerative feedback loop, said first and second resistors and said capacitor are all disposed in a first integrated circuit and said second and third transistors, said second degenerative feedback loop, said third and fourth resistors and said second capacitor are all disposed in a second integrated circuit substantially like said first integrated circuit.

References Cited by the Examiner

UNITED STATES PATENTS

| | | | |
|---|---|---|---|
| 2,959,741 | 11/1960 | Murray | 330—20 |
| 3,070,762 | 12/1962 | Evans. | |
| 3,141,135 | 7/1964 | Amlinger et al. | |
| 3,142,021 | 7/1964 | Stelmak | 330—39 |
| 3,165,708 | 1/1965 | Stelmak et al. | |
| 3,168,706 | 2/1965 | Brenig | 330—19 X |
| 3,174,112 | 3/1965 | Stelmak | 330—39 X |

ROY LAKE, *Primary Examiner.*

F. D. PARIS, *Assistant Examiner.*